United States Patent
de Santis et al.

(10) Patent No.: US 10,862,392 B2
(45) Date of Patent: Dec. 8, 2020

(54) CHARGE PUMP CIRCUIT WITH IMPROVED DISCHARGE AND CORRESPONDING DISCHARGE METHOD

(71) Applicant: STMicroelectronics S.r.l., Agrate Brianza (IT)

(72) Inventors: Fabio de Santis, Milan (IT); Dario Livornesi, Milan (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 16/677,387

(22) Filed: Nov. 7, 2019

(65) Prior Publication Data

US 2020/0161966 A1  May 21, 2020

(30) Foreign Application Priority Data

Nov. 21, 2018 (IT) .......... 102018000010482

(51) Int. Cl.
*H02M 3/07* (2006.01)
*G11C 5/14* (2006.01)

(52) U.S. Cl.
CPC .......... *H02M 3/07* (2013.01); *G11C 5/145* (2013.01)

(58) Field of Classification Search
CPC .. H02M 3/07; H02M 3/073; H02M 2003/071; H02M 2003/072; H02M 2003/075; H02M 2003/076
See application file for complete search history.

(56) References Cited

U.S. PATENT DOCUMENTS

| | | | | | |
|---|---|---|---|---|---|
| 5,159,543 A | * | 10/1992 | Yamawaki | .............. | H02M 1/36 363/60 |
| 5,175,706 A | * | 12/1992 | Edme | .............. | G11C 16/04 327/105 |
| 6,249,445 B1 | * | 6/2001 | Sugasawa | .............. | H02M 3/073 307/110 |
| 6,707,716 B2 | * | 3/2004 | Natori | .............. | G11C 5/145 365/185.18 |
| 7,403,405 B2 | * | 7/2008 | Conte | .............. | H02M 3/073 363/59 |
| 7,502,264 B2 | * | 3/2009 | Rodgers, III | .............. | G11C 5/145 365/185.11 |
| 7,663,960 B2 | * | 2/2010 | Suzuki | .............. | G11C 5/145 365/189.11 |
| 7,876,079 B2 | * | 1/2011 | Nirschl | .............. | H02M 3/07 323/283 |

(Continued)

*Primary Examiner* — Thomas J. Hiltunen
(74) *Attorney, Agent, or Firm* — Slater Matsil, LLP

(57) ABSTRACT

A charge pump circuit has a plurality of charge pump stages cascaded to one another between an input terminal and an output terminal to provide an output voltage having a boosted value with respect to the input voltage. A clock generator is configured to generate a clock signal provided to the charge pump stages to perform the boosting of the input voltage. An output-voltage regulation feedback closed-loop is coupled to the clock generator to perform a regulation of the output voltage based on a feedback voltage. A discharge control stage is configured to control a discharge of the charge pump circuit by generating a first discharge control signal configured to disable the output-voltage regulation feedback closed-loop or a second discharge control signal configured to reduce the frequency of the clock signal.

23 Claims, 4 Drawing Sheets

(56) References Cited

U.S. PATENT DOCUMENTS

| | | | |
|---|---|---|---|
| 8,022,749 B2* | 9/2011 | Schatzberger | H02M 3/073 323/313 |
| 9,019,003 B2* | 4/2015 | Kim | G11C 7/12 327/536 |
| 9,281,744 B2* | 3/2016 | Kropfitsch | H02M 3/073 |
| 2008/0055991 A1* | 3/2008 | Kim | G11C 16/0483 365/185.11 |
| 2008/0137428 A1* | 6/2008 | Nakai | G11C 5/14 365/185.18 |
| 2008/0290931 A1 | 11/2008 | Tran et al. | |
| 2010/0123512 A1 | 5/2010 | Imai et al. | |

* cited by examiner

CHARGE PUMP CIRCUIT WITH IMPROVED DISCHARGE AND CORRESPONDING DISCHARGE METHOD

CROSS-REFERENCE TO RELATED APPLICATIONS

This application claims priority to Italian Patent Application No. 102018000010482, filed on Nov. 21, 2018, which application is hereby incorporated herein by reference.

TECHNICAL FIELD

The present disclosure relates generally to an electronic system and method, and, in particular embodiments, to a charge pump circuit with improved discharge and to a corresponding method for improved discharge of a charge pump circuit.

BACKGROUND

As is known, charge pump circuits are commonly used in a wide range of electronic devices and applications to generate output voltage values higher than a given input voltage (basically operating as DC-DC boost converters), exploiting clocked charge transfer between capacitors used as charge-accumulation elements.

In particular, in SoC (System on Chip) applications, there is often a need to generate internal high voltages, in order to drive specific circuit blocks to appropriate voltage values for specific operations. Typically, charge pump circuits are used for this purpose.

A common example is the case of non-volatile memories, e.g. of the flash or EEPROM type, where programming and erasing operations are performed by applying high electrical fields on memory cell terminals, which use voltages in the range of tens of volts. These voltages are internally generated through charge pump circuits, starting from the low value of an internal supply voltage (the so-called logic supply voltage, VDD, with values, for example, comprised between 1 V and 1.35 V, for CMOS flash-memory devices in 90-nm technology).

Typical manufacturing processes of the applications in which these internal high voltages are developed do not provide high-voltage MOS transistors (i.e., transistors able to sustain high voltage values between their conduction and control terminals). Therefore, the generation of the internal high voltages is generally managed with appropriate charge pump circuits (e.g., voltage doubler, Dickson charge pump circuits), having a "low-voltage" architecture, typically composed of a series of boosting voltage stages (e.g., voltage doublers) driven by a clock.

Because of the lack of availability of high voltage MOS transistors, the charge pump architecture is typically designed not to exceed Safe Operating Area (SOA) requirements (e.g., in terms of breakdown voltages of junctions and/or gate oxide degradation) using appropriate techniques that generate a sort of "internal self-cascoding" to reach the high output voltage (i.e., each boosting voltage stage is protected by the previous stage in the series connection so that a low and sustainable voltage is present across its input and output terminals).

FIG. 1 shows a schematic block diagram of a known charge pump circuit 1, having a low-voltage architecture.

The charge pump circuit 1 has an input terminal IN, on which it receives an input voltage having a low value, e.g., the logic supply voltage VDD, and an output terminal OUT, on which it supplies an output voltage Vout for a load (here not shown). The output voltage Vout has a suitably boosted value with respect to the input voltage.

The charge pump circuit 1 includes a plurality of charge-pump stages 2 (in the example, four in number, denoted with Stage1, Stage2, Stage3 and Stage4), cascaded (or series-connected) between the input terminal IN and the output terminal OUT. The charge pump circuit 1 also includes a clock generator 3, which provides to each of the stages 2, clock, or phase, signals CLK.

In the example, each stage 2 receives from the clock generator 3 a first clock signal CLK and a second clock signal CLKN, having negated (or complementary) values with respect to one another, having, for example, logic values equal alternatively to 0 V (ground, GND) or to VDD.

An intermediate node NS (in the example denoted with NS1-NS3) is present between consecutive stages 2 in the charge pump circuit 1 (the intermediate node NS thus generally corresponding to the output of a previous charge-pump stage Stagei-1, and to the input of a next charge-pump stage Stagei).

Each charge-pump stage Stagei is configured to boost the voltage at the output of the previous charge pump stage Stagei-1, e.g., of a value corresponding to the logic voltage VDD, thus jointly contributing to the overall boosting of the input voltage.

In an exemplary solution, here not discussed in detail, charge-pump stages 2 envisage only low voltage transistors (having, for example, a maximum sustainable voltage not higher than the logic voltage VDD) and may be of the so-called latch type. Each charge-pump stage 2 may comprise a first pump capacitor and a second pump capacitor, receiving the first low-voltage clock signal CLK or the second low voltage clock signal CLKN, and a latch circuit providing switches designed to enable selective and alternate transfer of the charge accumulated in the pump capacitors from one stage to the next. In particular, transfer of charge is performed between first pump capacitors of consecutive stages, in a first half-period of the clock signal CLK, and between second pump capacitors of consecutive stages, in a second half-period of the same clock signal CLK, thus guaranteeing the voltage-boost effect between the respective input and output terminals.

The charge pump circuit 1 further includes an output-voltage detection stage 4, coupled to the output terminal OUT, and designed to provide a feedback voltage Vf as a function of the output voltage Vout.

In this example, the output-voltage detection stage 4 implements a so-called "resistor ladder," and includes a number of load elements 5, in the example resistor elements, series-connected between the output terminal OUT and a reference terminal (e.g., at ground, GND) providing a voltage divider. The feedback voltage Vf is the voltage at an intermediate node COMP between consecutive resistor elements 5 and is given by a corresponding partition of the output voltage Vout.

The charge pump circuit 1 further comprises a comparator stage 6, implemented via an operational amplifier, having a comparison input coupled to the output-voltage detection stage 4 (to the intermediate node COMP), to receive the feedback voltage Vf, and a reference input, receiving a reference voltage Vref, having a suitable value.

The comparator stage 6, based on the result of the comparison between the feedback voltage Vf and the reference voltage Vref, generates a stop signal St that is provided to the clock generator 3. In particular, a given value, e.g., a high value, of the stop signal St (indicative of reaching of a desired value for the output voltage Vout, set by the reference voltage Vref) determines the stop of the clock signal generation by the clock generator 3 and thereby the stop of charge transfer between the charge-pump stages 2 and of the voltage boosting operations.

The output-voltage detection stage 4 and the comparator stage 6 thus jointly implement a closed loop regulation of the output voltage Vout of the charge pump circuit 1, based on the reference voltage Vref.

Even if the above-discussed charge-pump architecture is largely used to generate a high voltage output, it requires having a similar approach in order to discharge the charge pump circuit 1, i.e., its output terminal OUT and the intermediate nodes NS, when a low voltage value has to be connected to the same output terminal OUT. For example, in non-volatile memory applications, a low voltage output is generally required for reading operations, while boosted high voltage values are generally required for programming operations.

Several approaches to discharge a charge pump circuit (i.e., the output terminal and internal charge-pump nodes) can be used and have been proposed. Discharge of the charge pump circuit commonly implies using different and additional circuitry, including dedicated discharge blocks, with a corresponding increased area occupation and power consumption.

FIG. 2 diagrammatically shows an example of a discharging circuit 8, designed to be operatively coupled in parallel to a charge pump circuit (e.g., the charge pump circuit 1 of FIG. 1, here not shown in detail).

A typical discharge technique is based on the introduction of complex external discharge stages (denoted with $DISCH_1$, $DISCH_2$, $DISCH_3$, ..., $DISCH_n$), to define different discharge paths versus a fixed or variable power supply (using a controlled current, or low resistive path, or an equivalent approach). This approach typically requires a design care because of the need to be compliant with intermediate high or medium voltage nodes of the charge pump stages (e.g., NS1, NS2, ... or related) in order to avoid problems of safe operating area.

Alternatively, a single output discharge structure (DISCH out, shown in dashed line in FIG. 2) can be used, implying an even more challenging safe operating area control.

SUMMARY

This generic approach has a number of disadvantages:

since it is required to connect charge pump intermediate internal nodes (e.g., NS1, NS2, ... or related) to the discharge paths, this implies having parasitic capacitance connected to the charge pump nodes that could compromise the charge pump performances;

all the internal nodes of both the charge pump circuit and the discharge paths have each time to respect safe operating area requirements for all transistors of the circuitry. This means that all nodes have to move with the same dynamic in order not to determine unexpected voltage differences on transistor terminals (independently from performances due to capacitive load, single transistor performances, process/temperature variations); and the use of the above discharge approach in a negative charge pump architecture may generate further issues in managing discharge paths, e.g., because of parasitic diodes.

Embodiments of the present invention provide a solution enabling the drawbacks of the known art to be overcome.

BRIEF DESCRIPTION OF THE DRAWINGS

For a better understanding of the present invention preferred embodiments thereof are now described, purely by way of non-limiting example, with reference to the attached drawings, wherein.

DETAILED DESCRIPTION OF ILLUSTRATIVE EMBODIMENTS

As will be discussed in detail in the following, an aspect of the present solution envisages use of the circuit stages and blocks already present in the charge pump circuit (i.e., the clock generator used to generate the clock signals and the closed-loop regulation stages), in order to implement discharge of the output terminal and the internal nodes, i.e., without additional discharge circuitry being required. Suitable control signals are generated and provided to the already present charge pump circuit stages, to control the discharge operation. A more efficient and easy to integrate approach to manage a generic high-voltage charge pump discharge implemented in a "low-voltage" CMOS technology is thus provided.

Figure 3:
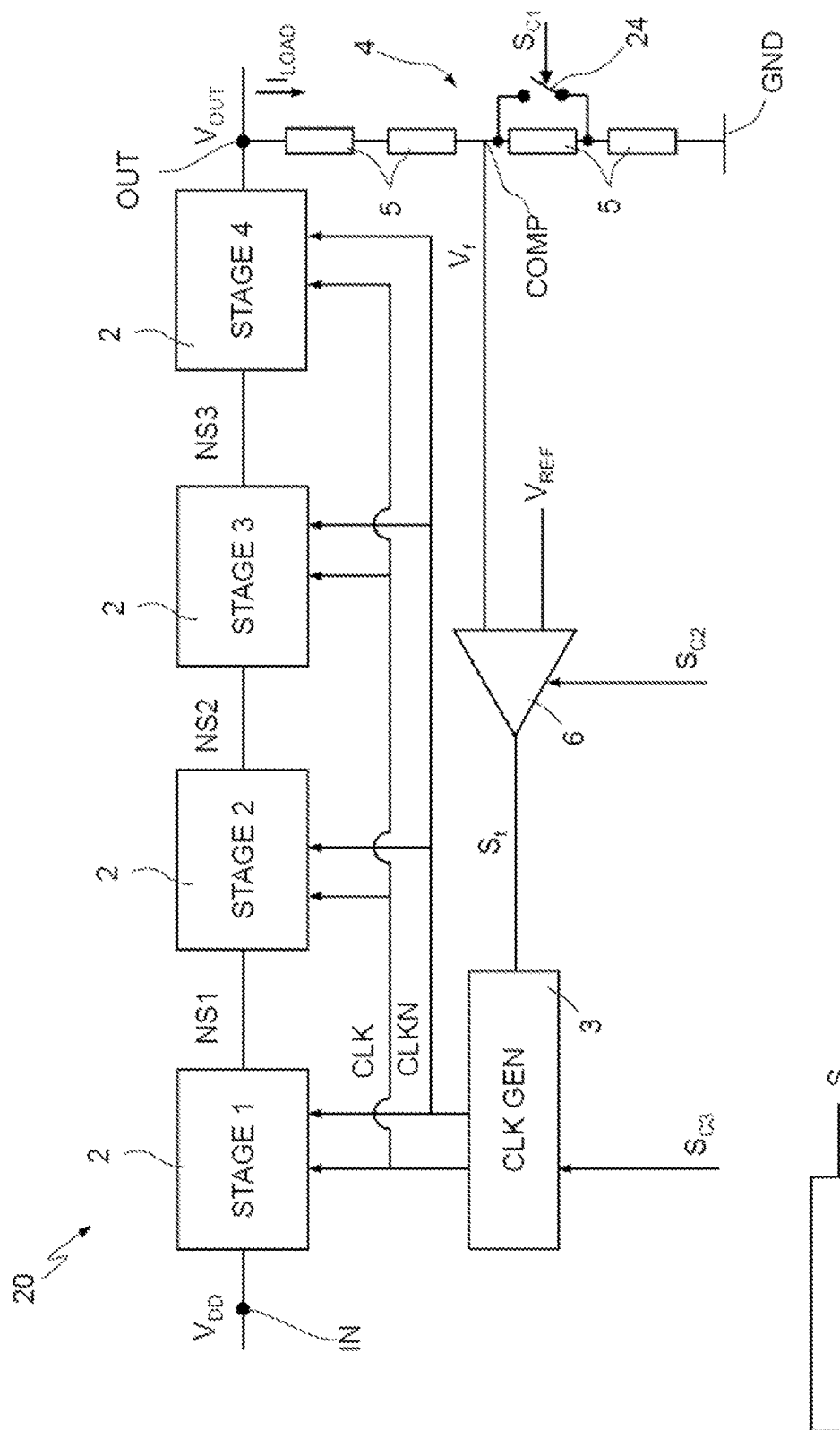
FIG. 3 is a schematic block diagram of a charge pump circuit with improved discharge, according to an embodiment of the present solution.
Figure 3:
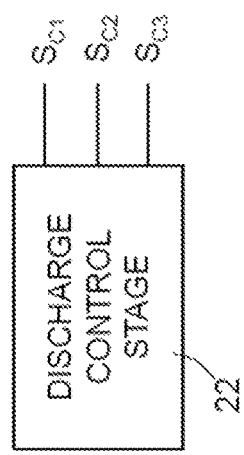

FIG. 3 shows a charge-pump circuit 20 with improved discharge, according to an embodiment of the present solution. Charge-pump circuit 20 has a circuit architecture substantially corresponding to the charge pump circuit 1 of FIG. 1 (so that elements corresponding to those already discussed are denoted with the same references and are not discussed again in detail).

Figure 1:
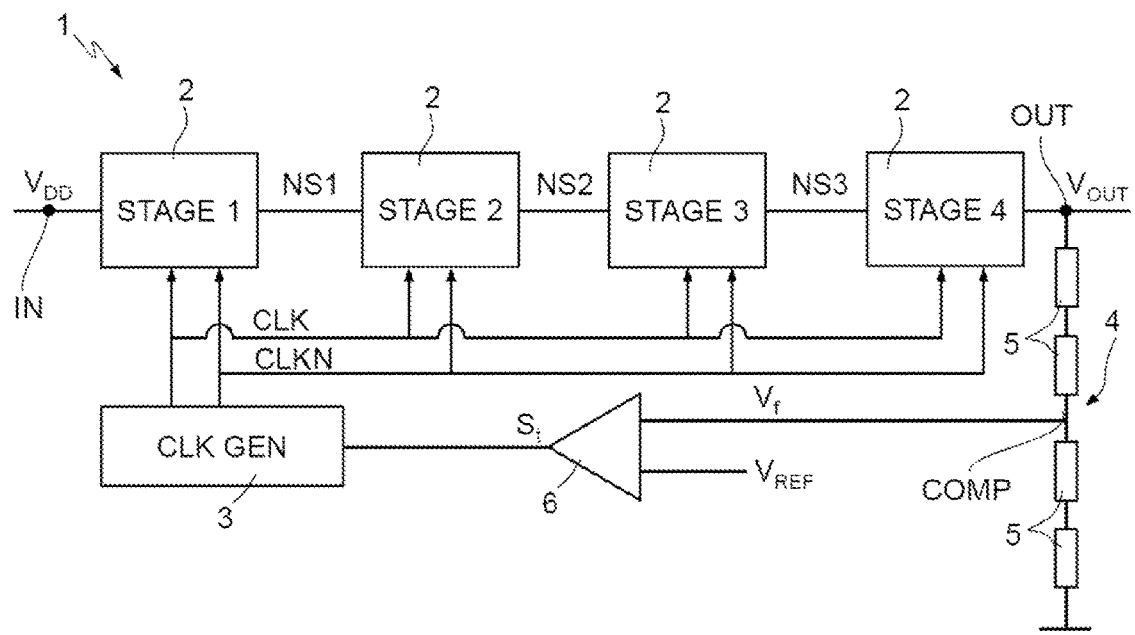
FIG. 1 is a schematic block diagram of a known charge pump circuit.
Figure 2:
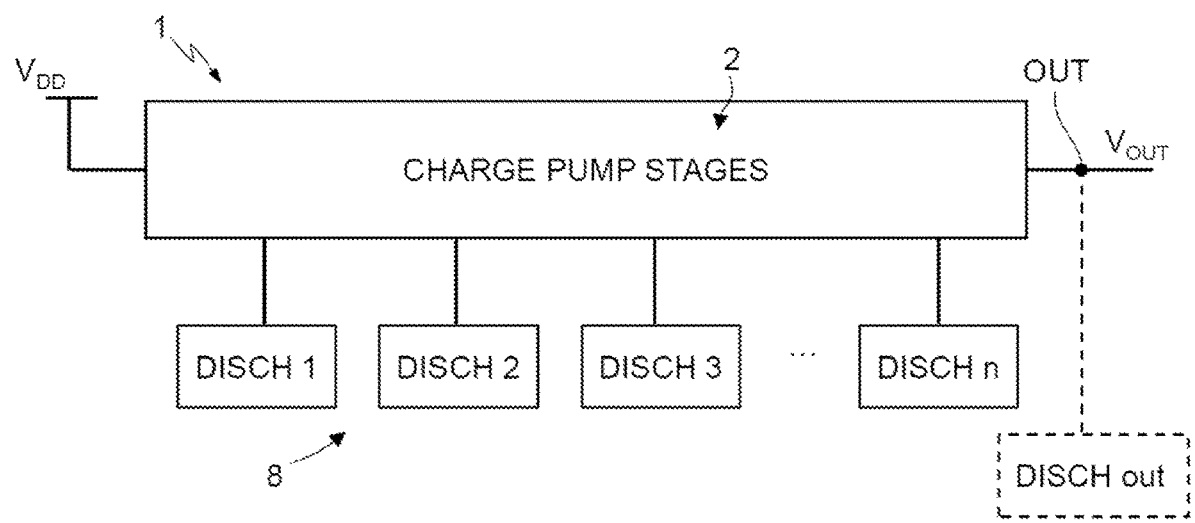
FIG. 2 is a diagrammatical depiction of a known discharge architecture for the charge pump circuit of FIG. 1.

Accordingly, the charge-pump circuit 20 comprises, as previously discussed with reference to the same FIG. 1:

the series of charge-pump stages 2, cascaded connected between the input terminal IN, receiving the input voltage VDD, and the output terminal OUT, providing the output voltage Vout;

the clock generator 3, providing the clock signal CLK (in the example, the first and second clock signals CLK and CLKN), to control boosting operation of the charge-pump stages 2, in particular the capacitive charge transfer for the voltage-boosting effect; and the output-voltage regulation feedback closed-loop to control the value of the output voltage Vout based on the reference voltage Vref. The output-voltage regulation feedback closed-loop includes the output-voltage detection stage 4 and the comparator stage 6. The comparator stage 6 provides the stop signal St to the clock generator 3 to stop the clock signal generation and thereby the stop of charge transfer between the charge-pump stages 2 and of the voltage boosting operations when the desired value for the output voltage Vout, set by the reference voltage Vref, is reached.

According to an aspect of some embodiments, the charge-pump circuit 20 further comprises a discharge control stage 22 configured to generate discharge control signals to implement a discharge operation of the output voltage Vout (and of the voltages at the intermediate nodes NS between the charge-pump stages 2).

The discharge control stage 22 may be implemented by a control stage of the charge-pump circuit 20 (managing operation thereof, in a per-se known manner, here not discussed in detail) or may be implemented as a separate and additional control unit.

In particular, in an embodiment, the discharge control stage 22 is operatively coupled to the charge pump circuit 20, in particular to the output-voltage regulation feedback closed-loop and to the clock generator 3, and is configured to generate one or more of the following control signals (all having a low voltage value):

a control signal Sc1, designed to increase the current load of the charge pump circuit 20 and thus cause an "overload" thereof (as discussed in more details in the following);

a control signal Sc2, designed to disable the output-voltage regulation feedback closed-loop (again, as discussed in more details in the following); and a control signal Sc3, designed to reduce the frequency of the clock signal CLK that controls the clocked operation of the charge pump circuit 20.

In some embodiments, the control signal Sc1 is provided to the output-voltage detection stage 4 and is designed to increase the current load at the output terminal OUT, by bypassing or short-circuiting ("shorting") one or more of the load elements 5 of the same output-voltage detection stage 4. In the example, the control signal Sc1 controls opening/closing of a load switch 24 that is connected in parallel to a respective one of the load elements 5 (e.g., a resistor element of the resistor ladder coupled to the output terminal OUT); when the control signal Sc1 is active (asserted). For example, in an embodiment, the control signal Sc1 is asserted by having a high value. When the control signal Sc1 is asserted, the load switch 24 is closed and the corresponding load element 5 is shorted, thus causing an increase of the current load of the charge pump circuit 20 and a corresponding drop in the output voltage Vout.

In fact, the charge pump circuit 20 is typically designed to sustain the static current of the output-voltage detection stage 4 (in the example, of the resistor ladder) and, in case of other load coupled to the output terminal OUT (here not shown), based on a qualitative relationship that may be given by:

$$Vout \sim CLK\_Freq \cdot \frac{Stage\_Cap}{Iload} \quad [1]$$

where CLK_Freq is the clock frequency of the clock generator 3, i.e., the frequency of the clock signal CLK, Stage_Cap is the capacitance value of a single charge-pump stage 2 of the charge-pump circuit 20, and Iload is the output load current, at the output terminal OUT.

As shown by the above expression [1], an increase in the output load current Iload causes a corresponding decrease of the output voltage Vout, contributing to discharge of the output terminal OUT of the charge pump circuit 20.

It is underlined that load switch 24 can be coupled at any point between the ground reference GND and the intermediate node COMP on which the feedback voltage Vf is present (i.e., within the lower side of the resistor ladder); or, alternatively, at any point between the same intermediate node COMP and the output terminal OUT (i.e., within the upper side of the resistor ladder). It is also possible to envisage one or more load switches 24 in the lower side and one or more load switches 24 in the upper side of the same resistor ladder. The decision on where to place the load switch(es) 24 may depend, e.g., on the voltage value across the terminals of the same load switch(es) 24, which should respect SOA requirements (since, in a typical embodiment, load switch 24 is implemented with a low-voltage CMOS transistor).

The control signal Sc2 is provided to the comparator stage 6 and is designed to disable the same comparator stage 6 (and the operation of comparison between the feedback voltage Vf and the reference voltage Vref), when the charge pump circuit 20 has to be discharged.

In particular, the comparator stage 6 is disabled (e.g. with the control signal Sc2 being active (asserted), e.g., such as having a high value), in order to maintain a free-running clock generator 3 during discharge operation. Therefore, the clock generator 3 continues the clock signal generation throughout the discharge phase, even if, during the same discharge phase, the output-voltage regulation feedback closed-loop is disabled.

The control signal $S_{c3}$ is provided to the clock generator 3 and it is designed to cause the reduction of the clock frequency thereof, i.e., a frequency reduction of the clock signal CLK, from a first frequency value CLK_Freq to a second frequency value CLK_Freq', where the second frequency value CLK_Freq' is lower than the first frequency value CLK_Freq. This frequency reduction may be obtained, e.g., by reducing the current supplied to the clock generator oscillator, with no added circuit blocks.

Referring to the same expression [1] discussed above, it is evident that the reduction of the frequency of the clock signal CLK causes a further overload of the charge pump circuit 20, which generates a further drop of the output voltage $V_{out}$.

The new frequency value, in addition with the increase of the load current Iload during the discharge, thus defines the timing and performance of the discharge operation. As shown in the above expression [1], the clock frequency CLK_Freq is directly proportional to the output voltage $V_{out}$.

Without considering the contribution of the current load increase, to obtain a desired decrease in the output voltage $V_{out}$, the frequency reduction factor has to be at most the ratio between the desired value of the output voltage $V_{out}$ after discharge, preserving SOA requirements, and the value of the same output voltage $V_{out}$ during the normal high voltage operation. In some embodiments, a constraint for the minimum value of the same frequency reduction factor is given by the maximum timing allowed, by design, to discharge the output terminal OUT and to achieve the desired decrease of the output voltage $V_{out}$.

For example, a possible value of the frequency reduction factor is comprised between 10 and 20 (e.g., the second frequency value CLK_Freq' being ¹⁄₁₀ or ¹⁄₂₀ of the first frequency value CLK_Freq).

It is underlined that the proposed discharge technique uses a reduced clock frequency, but does not require a stop of the clock generation (i.e., the second frequency value CLK_Freq' is higher than zero). Indeed, since the charge pump circuit 20 is still working during the discharge phase (i.e., the voltage boosting effect is still operating), although with reduced performances, due to the continuing presence of the clock signal CLK supplied to all the charge-pump stages 2, it is possible to achieve the "overload transferring effect" from the output terminal OUT to each charge-pump stage 2 of the charge pump circuit 20. Accordingly, all the intermediate nodes NS of the same charge pump circuit 20 (NS1, NS2, ... ) are discharged with a suitable voltage difference being maintained between the consecutive intermediate nodes NS.

In other words, differently from discharge approaches known to the art, the intermediate nodes NS maintain the "self cascoding" architecture also during charge pump discharge, because the charge pump is still operating. This avoids issues in the safe operating area for all MOS transistors of the circuitry.

Figure 4:
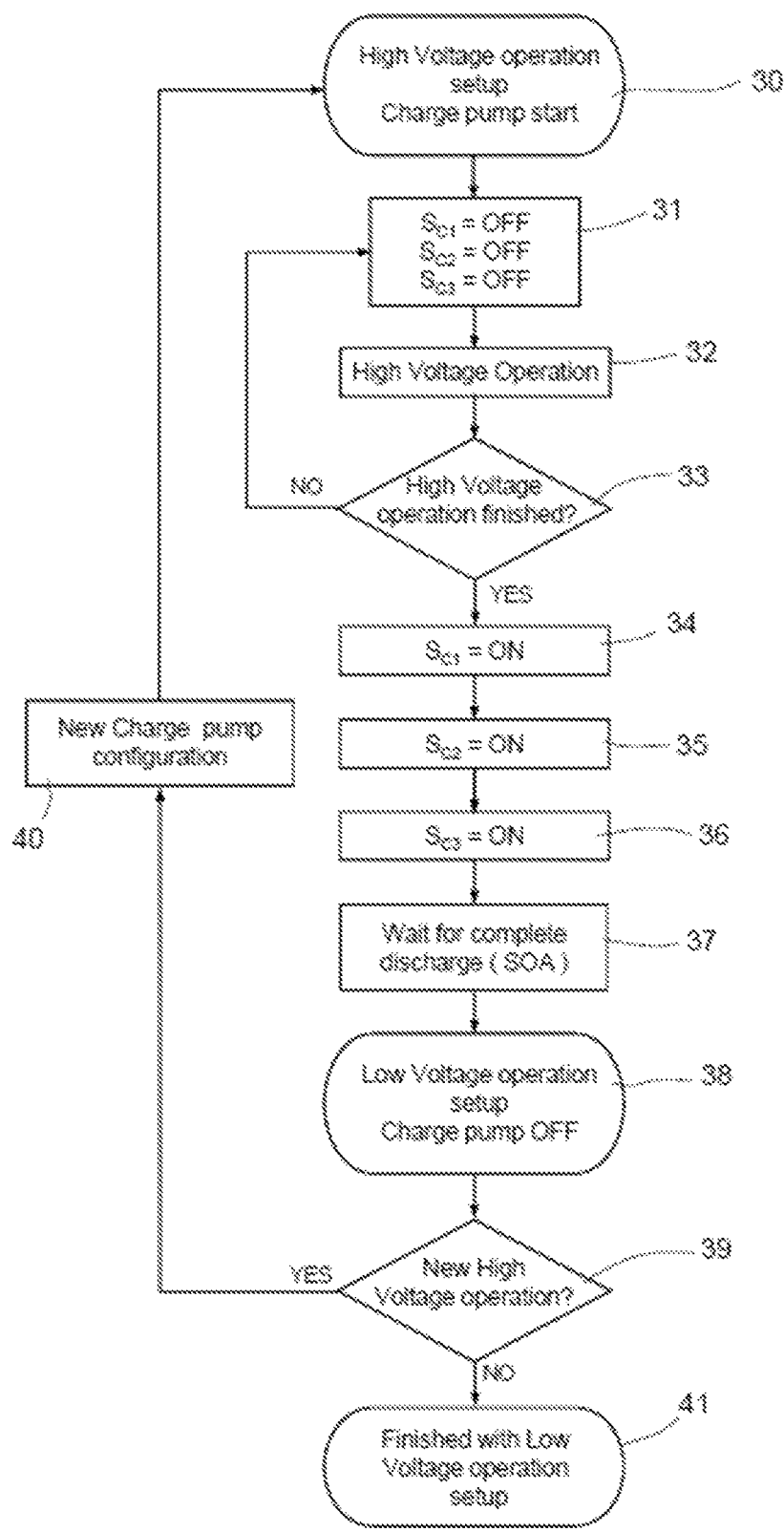
FIG. 4 is a flow chart of discharge operations according to a discharge method in the charge pump circuit of FIG. 3.

With reference to FIG. 4, a possible operation of the charge pump circuit 20, with particular reference to the discharge process, is discussed, according to an embodiment of the present invention.

As shown at step 30, operation of the charge pump circuit 20 starts, with setup for high voltage operation, i.e., for generation of a high-value output voltage $V_{out}$ at the output terminal OUT.

Accordingly, as shown at step 31, the control signals managed by the discharge control stage 22 are set in the not active state. For example, in this embodiment, the control signals $S_{c1}$, $S_{c2}$, and $S_{c3}$ are set at the low value ('0').

High voltage operation of the charge pump circuit 20 is then performed, as shown at step 32, until it is determined (at step 33) that discharge of the charge pump circuit 20 has to be performed (since a low voltage operation is required).

The discharge process of the charge pump circuit 20 is then started. In particular, at step 34, the discharge control stage 22 sets in the active state the control signal $S_{c1}$, so as to increase the load current Iload at the output terminal OUT of the same charge pump circuit 20.

Then, at step 35, the same discharge control stage 22 sets in the active state the control signal $S_{c2}$, so as to disable the comparator stage 6 and maintain the free-running operation of the clock oscillator as long as the discharge operation is performed.

Afterwards, at step 36, the discharge control stage 22 sets in the active state the control signal $S_{c3}$, so as to cause the reduction of the clock frequency and thus determine a further overload of the charge pump circuit 20.

Complete discharge of the charge pump circuit 20 is then monitored, at step 37, e.g., monitoring lapse of a pre-set discharge time or a suitable decrease of the value of the output voltage $V_{out}$, or of one or more of the intermediate nodes NS.

When discharge is completed, the charge pump circuit 20 is stopped and low-voltage operations are performed, using the output voltage $V_{out}$, or the voltage of one or more of the intermediate nodes NS of the same charge pump circuit 20, as shown at step 38.

If it is determined, at step 39, that a new high voltage operation is to be performed, a new charge pump configuration is applied, at step 40, and then operation return to step 30, for a new start of the charge pump circuit 20.

Otherwise, operation of the charge pump circuit 20 terminates, as shown at step 41, after the low-voltage operation.

Figure 5A:
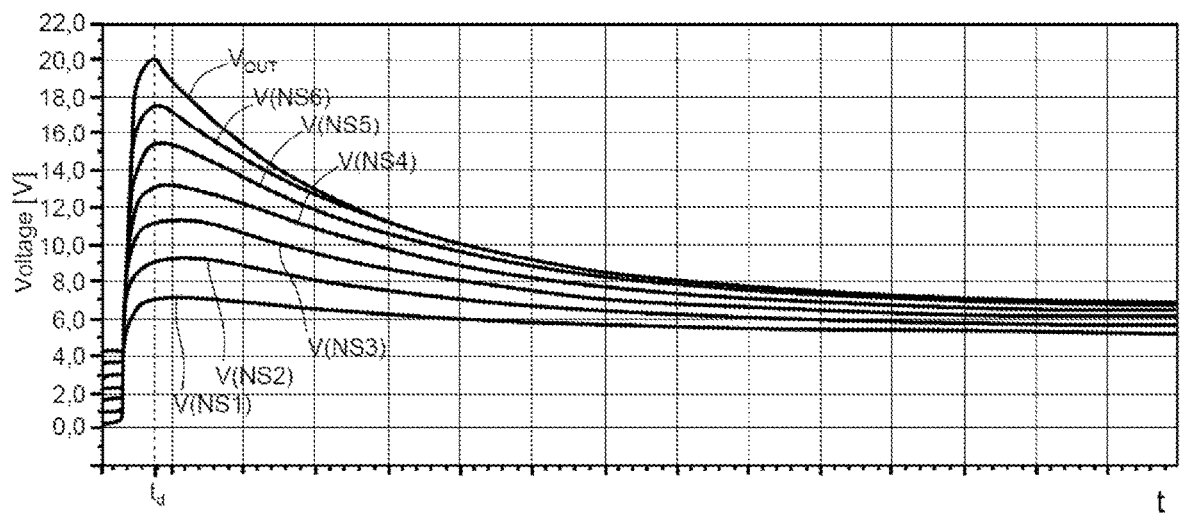
FIGS. 5A and 5B shows plots of quantities related to operation of the charge pump circuit of FIG. 3.

FIG. 5A shows the plots of the output voltage $V_{out}$ and of the voltages, denoted with V(NS1)-V(NS6), of the intermediate nodes NS1-NS6 of the charge pump circuit 20 (having in this case a number of charge-pump stages 2 equal to seven), during the operations discussed above with reference to FIG. 4.

Figure 5B:
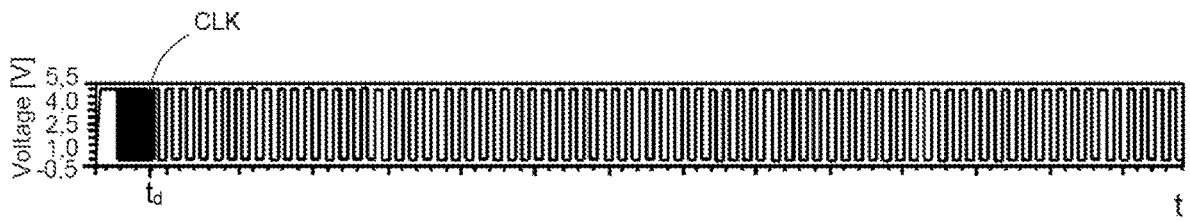

FIG. 5B shows the corresponding plot of the clock signal CLK generated by the clock generator 3.

As shown in FIG. 5A, after setup of the charge pump circuit 20 for the high voltage operation, the output voltage $V_{out}$ and the voltages V(NS1)-V(NS6) of the intermediate nodes NS1-NS6 rise until reaching a desired high value (in this case, a value of about 20 V for the output voltage $V_{out}$ and correspondingly decreased values for the voltages at the intermediate nodes NS1-NS6, with a difference of about 2 V between the intermediate voltage values of each consecutive charge pump stages 2).

At the end of the high voltage operation, at time $t_d$ in the plot, discharge of the charge pump circuit 20 is performed, as discussed above in detail. As shown in FIG. 5A, the output voltage $V_{out}$ and the voltages V(NS1)-V(NS6) of the intermediate nodes NS1-NS6 decrease until reaching a desired low value (in this case, a value of about 6.9 V for the output voltage $V_{out}$, considering a SOA value of about 7 V), allowing the circuitry to safely and correctly operate in a low-voltage condition after the discharge phase.

In particular, it can be noticed that all intermediate charge pump voltages discharge correctly, without superimposing each other and remaining all under the charge pump output voltage $V_{out}$ (in other words, during the discharge, even if the mutual differences between the voltages V(NS1)-V(NS6) of the intermediate nodes NS1-NS6 decrease, the relation between the same voltages is maintained throughout the whole discharge phase).

FIG. 5B shows the frequency reduction of the clock signal CLK, from the first frequency value CLK_Freq to the second frequency value CLK_Freq', lower than the first frequency value CLK_Freq, starting from time $t_d$ when the discharge phase begins (the second frequency value CLK_Freq' controlling the same discharge phase).

The advantages of some embodiments emerge clearly from the foregoing description.

In any case, it is again highlighted that the following advantages of some embodiments are provided:

no extra circuitry is added, so that no extra area and power consumption are required to manage the discharge operation;

the intermediate nodes NS of the charge pump circuit 20 are not connected to external nodes for the discharge phase or to external circuitry, so that the symmetry of the charge pump stages 2 is maintained;

no extra capacity is connected to the charge pump output terminal OUT, since all blocks used for the discharge are already present and are part of the same charge pump circuit 20;

all control signals $S_{c1}$-$S_{c3}$ used for the discharge operation are in the low voltage range, so no extra high voltage circuitry has to be generated for their managing;

charge pump intermediate nodes NS never exceed the charge pump output voltage $V_{out}$; and charge pump output voltage $V_{out}$ after discharge reaches a safe voltage (meeting SOA requirements).

Figure 6:
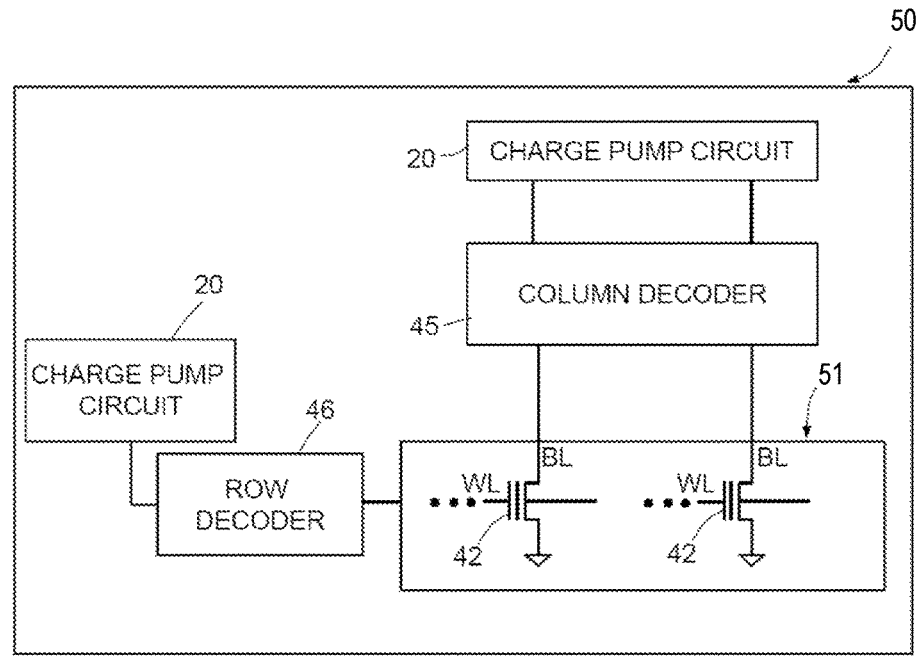
FIG. 6 shows a schematic block diagram of a non-volatile memory device including the charge pump circuit of FIG. 3, according to a further aspect of the present solution.

As shown schematically in FIG. 6, the charge pump circuit 20 can be advantageously used in a non-volatile memory device 50, for example of a CMOS flash type, comprising an array 51 of memory cells 42.

In a per-se known manner, the memory cells 42 have their gate terminal connected to a respective wordline WL and their drain terminal connected to a respective bitline BL. In the schematic representation shown, the charge pump circuit 20 is connected to the drain terminals of the memory cells 42, through interposition of a column decoder 45.

The load of the charge pump circuit 20 is in this case basically constituted by the capacitance of the bitlines BL of the memory array 51. The charge pump circuit 20 is in this case used for generating the high programming (writing/erasure) and the low reading voltages required for the memory cells 42.

As shown in the same FIG. 6, a further charge pump circuit 20 may be connected to a row decoder 46, coupled to the wordlines WL of the memory cells 42.

Finally, it is clear that modifications and variations may be made to what has been described and illustrated herein, without thereby departing from the scope of the present invention, as defined in the annexed claims.

In particular, generation of control signal Sc1 by the discharge control stage 22 may be avoided, even if its presence is preferred, since it gives benefit in assisting to further reduce the discharge time. In general, generation of control signal Sc1 is more advantageous the more capacitive is the load of the charge pump circuit 20, while its presence may be less advantageous when there is a high static current consumption as the charge pump load.

Likewise, generation of control signal Sc2 may be avoided, e.g., if the modification to the output-voltage detection stage 4 by the control signal Sc1 (by shorting one or more of the load elements 5 of the same output-voltage detection stage 4) is such as to cause the feedback voltage Vf to be always lower than the reference voltage Vref during the discharge phase, thereby disabling the output-voltage regulation feedback closed-loop.

It is also underlined that the reduction factor between the first and second frequency values CLK_Freq, CLK_Freq' of the clock signal CLK may be different (also possibly being equal to 1), depending on the specific application requirements.

Moreover, it is evident that the charge pump circuit may find advantageous, though not exclusive, application within a non-volatile memory device, for generating the required voltages for the programming and reading operations. However, other uses can be equally envisaged, in all those cases where it is required to generate a boosted voltage starting from a lower voltage value (and use of high voltage transistors is not available).

What is claimed is:

1. A charge pump circuit comprising:
    an input terminal configured to receive an input voltage;
    an output terminal;
    a plurality of charge pump stages cascaded to one another between the input terminal and the output terminal, the plurality of charge pump stages configured to jointly perform boosting of the input voltage to provide on the output terminal an output voltage having a boosted value with respect to the input voltage;
    a clock generator configured to generate a clock signal having a first frequency value provided to the plurality of charge pump stages to perform the boosting of the input voltage;
    an output-voltage regulation feedback closed-loop coupled to the clock generator and configured to detect a feedback voltage as a function of the output voltage and to generate a control signal provided to the clock generator to perform a regulation of the output voltage based on the feedback voltage, wherein the output-voltage regulation feedback closed-loop comprises a voltage detection stage coupled to the output terminal and configured to provide the feedback voltage as a function of the output voltage; and
    a discharge control stage configured to control discharge of the charge pump circuit by generating a first discharge control signal configured to disable the output-voltage regulation feedback closed-loop, or a second discharge control signal configured to reduce a frequency of the clock signal from the first frequency value to a second frequency value lower than the first frequency value, and further generating a third discharge control signal configured to cause an increase of a current load on the output terminal by the voltage detection stage.

2. The circuit of claim 1, wherein the discharge control stage is configured to generate the first discharge control signal and the second discharge control signal.

3. The circuit of claim 1, wherein the second frequency value is higher than zero so that the plurality of charge pump stages perform boosting operation during discharge of the charge pump circuit.

4. The circuit of claim 1, wherein the second frequency value is comprised between $1/20$ and $1/10$ of the first frequency value.

5. The circuit of claim 1, wherein the output-voltage regulation feedback closed-loop comprises
    a comparator stage configured to perform a comparison between the feedback voltage and a reference voltage and to generate the control signal based on the comparison.

6. The circuit of claim 5, wherein the voltage detection stage comprises a plurality of load elements that are series-connected between the output terminal and a reference terminal to form a voltage divider, the feedback voltage being a voltage at an intermediate node between the plurality of load elements, wherein the third discharge control signal is configured to short-circuit a first load element of the plurality of load elements.

7. The circuit of claim 6, wherein the third discharge control signal is configured to selectively close a load switch that is coupled in parallel to the first load element.

8. The circuit of claim 5, wherein the first discharge control signal is configured to disable the comparator stage.

9. A non-volatile memory device comprising:
    a memory array comprising a plurality of memory cells; and
    a charge pump circuit having an output terminal coupled to the memory array, the charge pump circuit configured to generate a boosted output voltage for first memory operations, and to undergo a discharge to provide a low output voltage for second memory operations different from the first memory operations, the low output voltage being lower than the boosted output voltage, wherein the charge pump circuit comprises:
        a plurality of charge pump stages coupled between an input terminal of the charge pump circuit and the output terminal,
        a clock generator configured to provide a clock signal to the plurality of charge pump stages,
        an output-voltage regulation feedback closed-loop coupled to the clock generator and configured to detect a feedback voltage as a function of the boosted output voltage and to generate a control signal provided to the clock generator to perform a regulation of the boosted output voltage based on the feedback voltage, wherein the output-voltage regulation feedback closed-loop comprises a voltage detection stage coupled to the output terminal and configured to provide the feedback voltage as a function of the boosted output voltage, and a discharge control stage configured to discharge the charge pump circuit by generating a first discharge control signal configured to disable a feedback loop of the charge pump circuit or a second discharge control signal configured to reduce a frequency of the clock signal, and to further generate a third discharge control signal configured to cause an increase of a current load on the output terminal by the voltage detection stage.

10. The device of claim 9, wherein the first memory operations comprise writing operations, and wherein the second memory operations comprise reading operations.

11. The device of claim 9, wherein the discharge control stage is configured to generate the first discharge control signal and the second discharge control signal.

12. The device of claim 9, wherein the discharge control stage is configured to cause the increase of the current load by shorting a resistor of the voltage detection stage.

13. The device of claim 9, wherein the output-voltage regulation feedback closed-loop comprises a comparator stage configured to perform a comparison between the feedback voltage and a reference voltage and to generate the control signal based on the comparison.

14. A method for discharging a charge pump circuit, the method comprising:
receiving an input voltage at an input terminal;
boosting the input voltage using a plurality of charge pump stages coupled between the input terminal and an output terminal to produce an output voltage at the output terminal;
providing a clock signal to the plurality of charge pump stages;
providing, with a comparator of an output-voltage regulation feedback closed-loop, a stop signal to a clock generator that provides the clock signal;
receiving, by the comparator, a reference voltage; and
receiving, by the comparator, a feedback voltage from a voltage divider that is coupled to the output terminal, and
discharging the charge pump circuit by:
disabling the output-voltage regulation feedback closed-loop of the charge pump circuit, or
reducing a frequency of the clock signal, and
causing an increase in a current load on the output terminal by shorting a resistor of the voltage divider.

15. The method of claim 14, wherein discharging the charge pump circuit comprises disabling the output-voltage regulation feedback closed-loop of the charge pump circuit, and reducing a frequency of the clock signal from a first frequency to a second frequency lower than the first frequency, the second frequency being higher than zero.

16. The method of claim 15, wherein the second frequency is between $1/20$ and $1/10$ of the first frequency.

17. The method of claim 14, wherein discharging the charge pump circuit comprises:
disabling the output-voltage regulation feedback closed-loop after causing the increase in the current load; and
reducing the frequency of the clock signal after disabling the output-voltage regulation feedback closed-loop.

18. The method of claim 14, further comprising
disabling the output-voltage regulation feedback closed-loop by disabling the comparator.

19. The method of claim 14, wherein the plurality of charge pump stages continue boosting the input voltage when discharging the charge pump circuit.

20. A charge pump circuit comprising:
an input terminal;
an output terminal;
a plurality of charge pump stages coupled between the input terminal and the output terminal;
a voltage divider coupled between the output terminal and ground;
a switch coupled across a resistor of the voltage divider;
a comparator having a first input coupled to an intermediate node of the voltage divider, and a second input configured to receive a reference voltage;
a clock generator coupled to the plurality of charge pump stages and having an input coupled to an output of the comparator; and
a discharge control stage configured to discharge the charge pump circuit by closing the switch.

21. The charge pump circuit of claim 20, wherein the discharge control stage is configured to discharge the charge pump circuit by disabling the comparator.

22. The charge pump circuit of claim 20, wherein the discharge control stage is configured to discharge the charge pump circuit by causing a reduction in a frequency of a clock signal provided by the clock generator.

23. The charge pump circuit of claim 22, wherein the discharge control stage is configured to discharge the charge pump circuit by:
disabling the comparator after closing the switch; and
causing a reduction in a frequency of the clock signal after disabling the comparator.

* * * * *